United States Patent
Krivokapic

(10) Patent No.: US 6,919,250 B2
(45) Date of Patent: Jul. 19, 2005

(54) MULTIPLE-GATE MOS DEVICE AND METHOD FOR MAKING THE SAME

(75) Inventor: Zoran Krivokapic, Santa Clara, CA (US)

(73) Assignee: Advanced Micro Devices, Inc., Sunnyvale, CA (US)

(*) Notice: Subject to any disclaimer, the term of this patent is extended or adjusted under 35 U.S.C. 154(b) by 91 days.

(21) Appl. No.: 10/442,131

(22) Filed: May 21, 2003

(65) Prior Publication Data

US 2004/0235283 A1 Nov. 25, 2004

(51) Int. Cl.⁷ .................. H01L 21/336; H01L 21/3205
(52) U.S. Cl. ........................... 438/283; 438/588
(58) Field of Search .................. 438/269, 277, 438/283, 588, 585, 592, 138

(56) References Cited

U.S. PATENT DOCUMENTS

| | | | | |
|---|---|---|---|---|
| 5,308,782 A | * | 5/1994 | Mazure et al. | 438/154 |
| 5,372,959 A | * | 12/1994 | Chan | 438/157 |
| 5,583,362 A | * | 12/1996 | Maegawa | 257/347 |
| 5,965,914 A | * | 10/1999 | Miyamoto | 257/331 |

* cited by examiner

Primary Examiner—Olik Chaudhuri
Assistant Examiner—Lex H. Malsawma

(57) ABSTRACT

A method for forming a semiconductor device with more than two gates involves the forming of a stack of n-conductive gate electrodes, where n>2. Silicon is formed around the gate stack and the silicon is doped to form source/drain regions. The multiple gates maximize the drive current for a given silicon area.

14 Claims, 5 Drawing Sheets

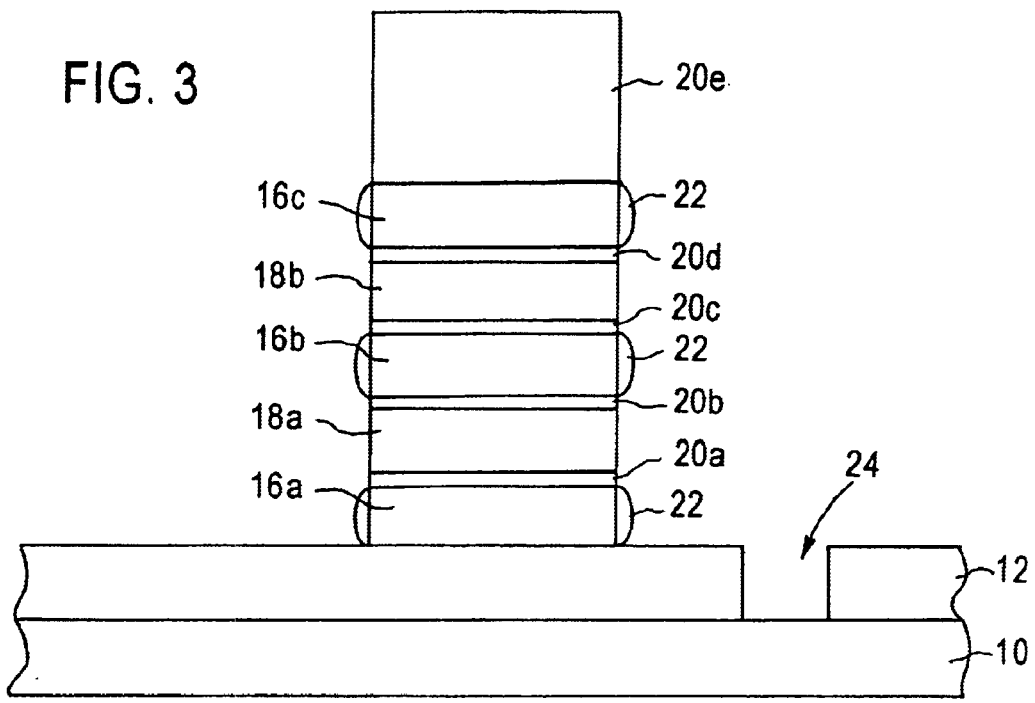
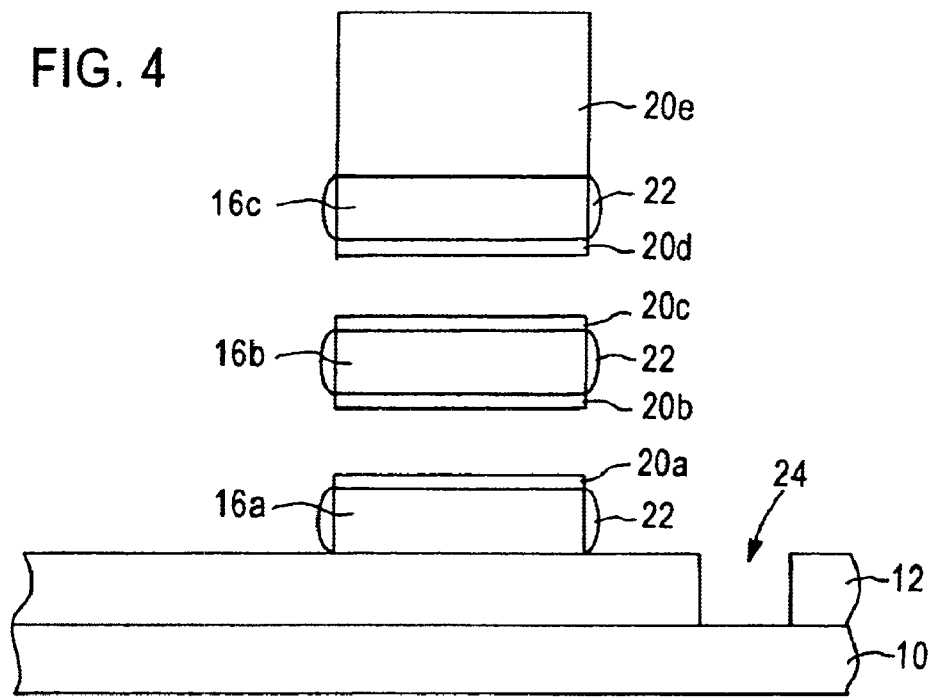

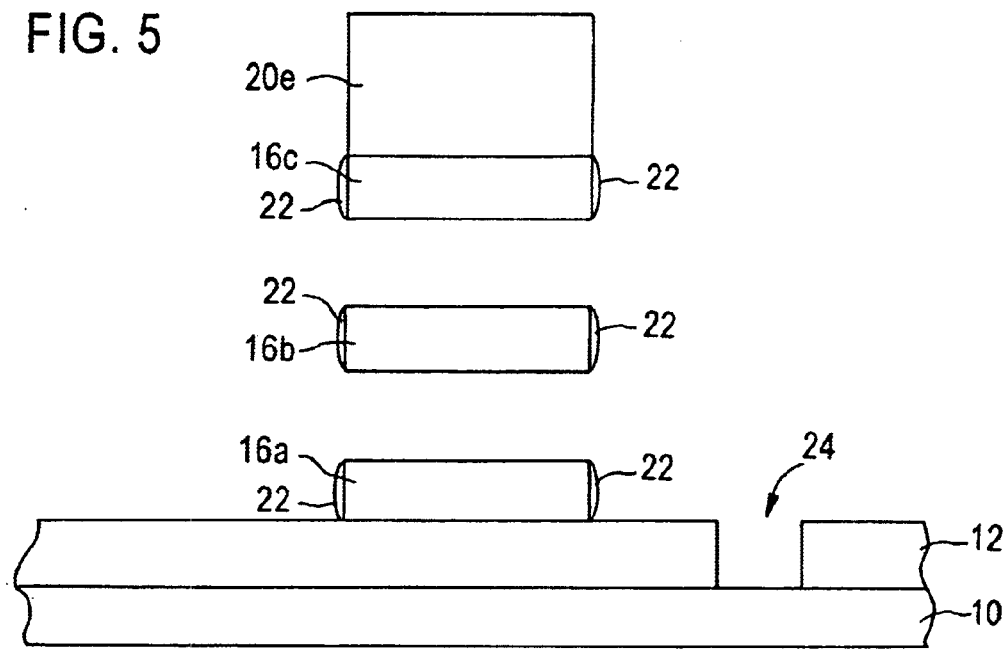
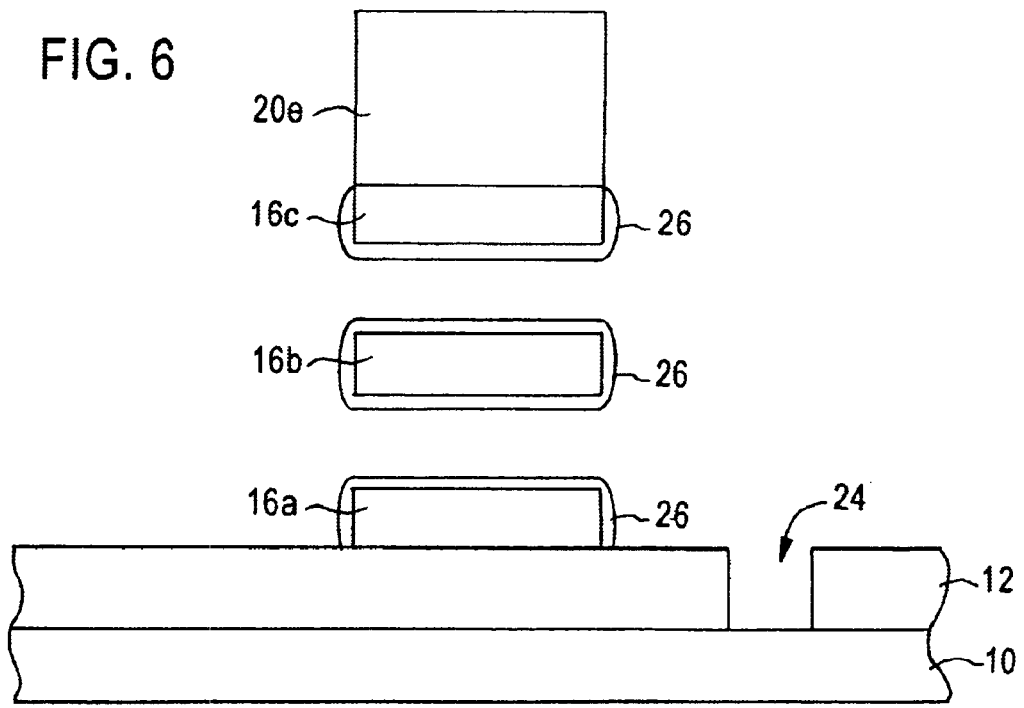

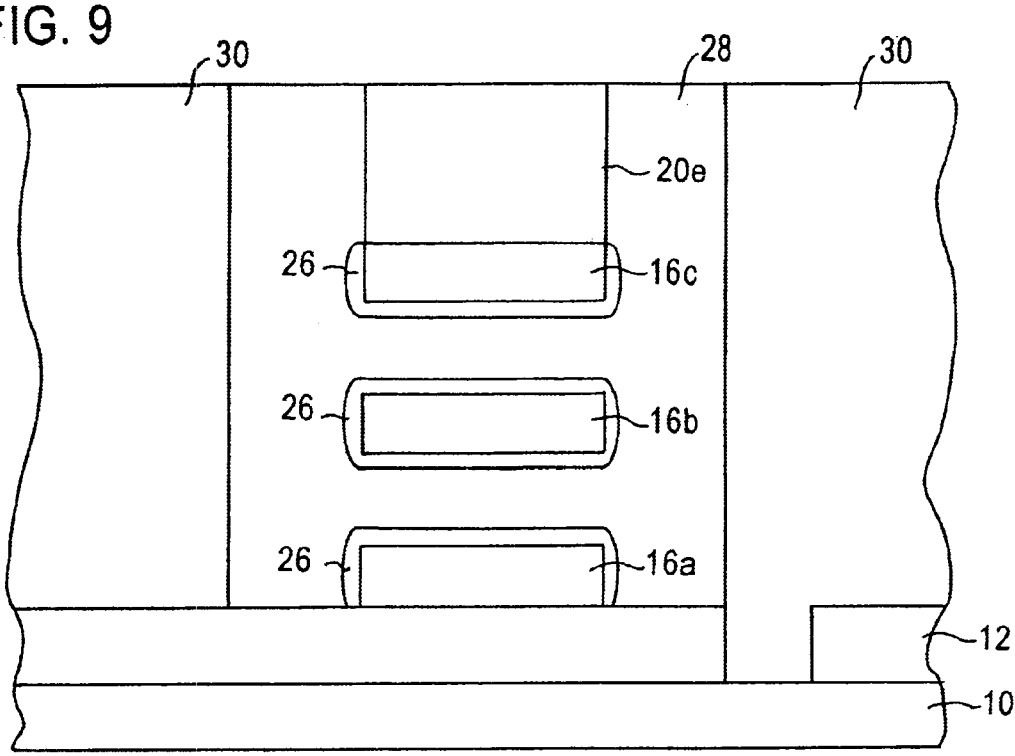
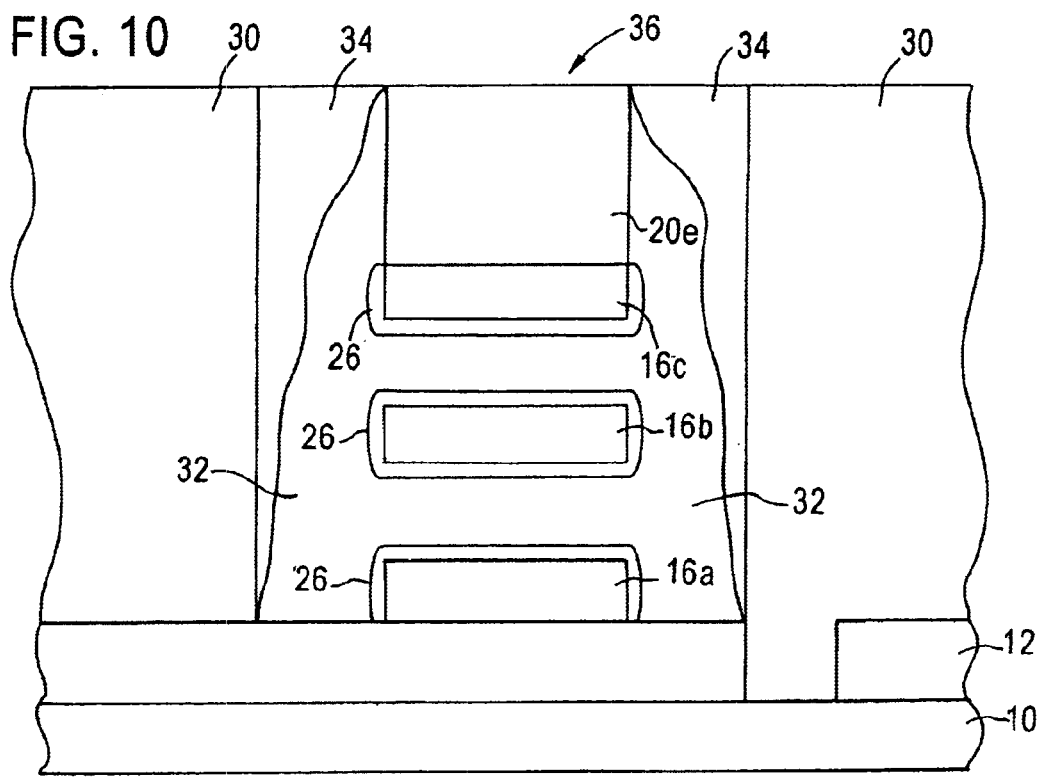

US 6,919,250 B2

MULTIPLE-GATE MOS DEVICE AND METHOD FOR MAKING THE SAME

FIELD OF THE INVENTION

The present invention relates to the field of semiconductor processing, and more particularly, to the formation of semiconductor devices with multiple gates.

BACKGROUND OF THE INVENTION

A conventional MOSFET operates by driving current through the channel region between the source and drain of a device. The conductivity of the channel region is modulated by the application of a voltage on the conducting gate above the channel surface and insulated from it. Efforts are ongoing within many MOS integrated circuit manufacturing companies as well as at many universities and government laboratories to improve the speed and available drive currents of MOSFETS to reduce their power consumption, and to improve their reliability and radiation hardness for applications in harsh or remote environments, including space.

Silicon-on-insulator (SOI) is a generic term describing technologies in which the MOSFET's or other active devices are built in a thin film of silicon over an insulating layer on a substrate. The presence of the insulator reduces the parasitic capacitances in the MOSFET compared to a bulk silicon device, resulting in an improvement in the speed and power dissipation of MOS integrated circuits, as well as improved immunity to single-upset of MOS memory elements in a radiation environment.

One of the goals in semiconductor processing is to maximize the use of the available silicon area. This allows increased miniaturization of the electronic circuitry. In particular, it is desirable to maximize the drive current for a given silicon area. Dual gate devices in which the drive current is doubled or a given silicon area have been created. Further improvement in maximizing the drive current for a given silicon area is desirable.

SUMMARY OF THE INVENTION

There is a need for a method of forming a MOS device with improved drive current performance for a given silicon area.

These and other needs are met by embodiments of the present invention that provide a method of forming an n-gate semiconductor device where n is greater than 2, comprising the steps of forming a stack of n-conductive gate electrodes, where n is greater than 2. Silicon is formed around the gate stack and the silicon is doped to form source/drain regions. In certain embodiments of the invention, the formation of the stack includes forming n-polysilicon layers, with each polysilicon layer having a first oxide layer directly beneath the polysilicon layer and a second oxide layer directly above the polysilicon layer. In certain embodiments, nitride layers are formed between the polysilicon layers and the stack is formed by first anisotropically etching the polysilicon layers, the nitride layers and the oxide layers to form a stack precursor, and then removing the nitride layers and at least some of the oxide layers in the stack precursor to create gaps between the polysilicon layers and the stack precursor. A gate dielectric material may be formed on the polysilicon layers and the stack precursor.

With the present invention, a greater number of gates than two can be formed in a stack of a semiconductor device. This n-gate device provide additional drive current for a given silicon area. For example, in the embodiments of the invention in which three gates are provided in the stack, four conductive channels are formed in the present invention and four times the drive current compared to a single conductive channel is achieved.

The earlier stated needs are also met by other embodiments of the present invention which provide a method of forming a MOS device having more than two gates, comprising the steps of forming a plurality of polysilicon gates in a stack, the plurality including at least three said gates. Gate dielectric is formed on each of the gates and silicon is formed with source/drain regions adjacent the gates and gate dielectric.

The foregoing and other features, aspects and advantages of the present invention will become more apparent from the following detailed description of the present invention when taken in conjunction with the accompanying drawings.

BRIEF DESCRIPTION OF THE DRAWINGS

FIG. 3 shows the structure of FIG. 2 following etching through of the buried oxide layer through a seed window in accordance with embodiments of the present invention.

FIG. 4 depicts the structure of FIG. 3 following the removal of nitride layers in the stack precursor.

FIG. 5 depicts the structure of FIG. 4 following the removal of oxide layers and the oxidized regions of the polysilicon layers in the stack precursor in accordance with embodiments of the present invention.

FIG. 6 shows the structure of FIG. 5 after gate dielectric has been formed on the silicon layers of the stack precursor, in accordance with embodiments of the present invention.

FIG. 9 shows the structure of FIG. 8 following the filling of the recesses in the buried oxide layer and formation of a layer of oxide and polishing, in accordance with embodiments of the present invention.

FIG. 10 shows the structure of FIG. 9 after a silicidation process has been performed to create silicide regions, in accordance with embodiments of the present invention.

DETAILED DESCRIPTION OF THE INVENTION

The present invention addresses and solves problems related to maximizing the drive current for a given silicon area in the formation of MOS devices. This is achieved, in part, by the provision of a method of forming a MOS device with a greater number of gates, such as three gates or more. The multiple gates of the MOS device are formed by creating a stack of silicon layers, nitride layers and oxide layers and then etching to form a stack precursor. The nitride layers and oxide layers are removed. Dielectric is then formed around the polysilicon layers as a silicon region is formed around the gate dielectric and the polysilicon gates.

After doping and silicidation, a semiconductor device having at least three gates is created.

Figure 1:
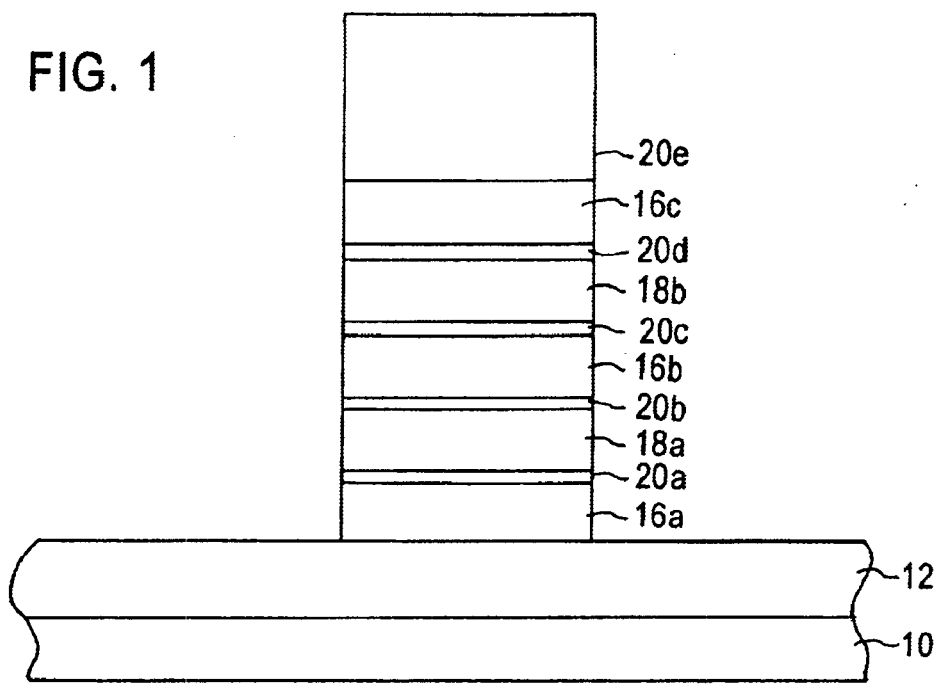
FIG. 1 is a schematic depiction of a portion of a semiconductor device during one phase of manufacture in accordance with embodiments of the present invention.

FIG. 1 schematically depicts a portion of a semiconductor wafer constructed in accordance with embodiments of the present invention during one phase of manufacture. A silicon substrate 10 is provided with an insulator layer 12 formed thereon. The insulator layer 12 may be a buried oxide layer, for example. In certain preferred embodiments of the invention, the buried oxide layer may 12 be between 100 to 200 nm thick.

A series of layers are formed on the buried oxide layer 12 and then etched anisotropically to form a stack precursor 14 as depicted in FIG. 1. The anisotropic etching may be performed by conventional methodologies, including, for example, employing reactive ion etches with suitable etch recipes for the various materials in the different layers.

The stack precursor 14 includes a number of polysilicon layers 16a–c, a number of nitride layers 18a–b and a number of oxide layers 20a–e. In certain preferred embodiments of the invention, the thickness of the polysilicon layers 16a–16c is between 25 to 35 nm. In certain embodiments of the invention, the top polysilicon layer 16C has a greater thickness than the polysilicon layers 16a–16b. For example, the upper polysilicon layer 16c may have a thickness of between about 35 to about 45 nm.

The thickness of the oxide layers 20a–20d may be between about 1 to about 10 nm in exemplary embodiments of the invention, with a preferred thickness of about 2 nm. Nitride layers 18a–18b, in exemplary embodiments of the invention, have a thickness of between about 2 to about 5 nm. In other embodiments of the invention, the thickness of the nitride is between about 5 to about 10 nm.

In certain embodiments of the invention, the thickness of the top oxide layer 20e is between about 40 to about 60 nm, with a preferred thickness of about 50 nm. It should be recognized that all of the above thickness ranges are exemplary only, as other thicknesses may be employed without departing from the scope of the present invention.

Following the formation of the stack precursor 14, the polysilicon layers 16a–16c are oxidized at a temperature of between about 900 to about 1000° C. in order to grow oxide on the sides of the polysilicon layers 16a–16c. This is depicted in FIG. 2 in which approximately 10 to approximately 15 nm of oxide 22 is formed on the sides of the polysilicon layers 16a–16c.

Figure 2:
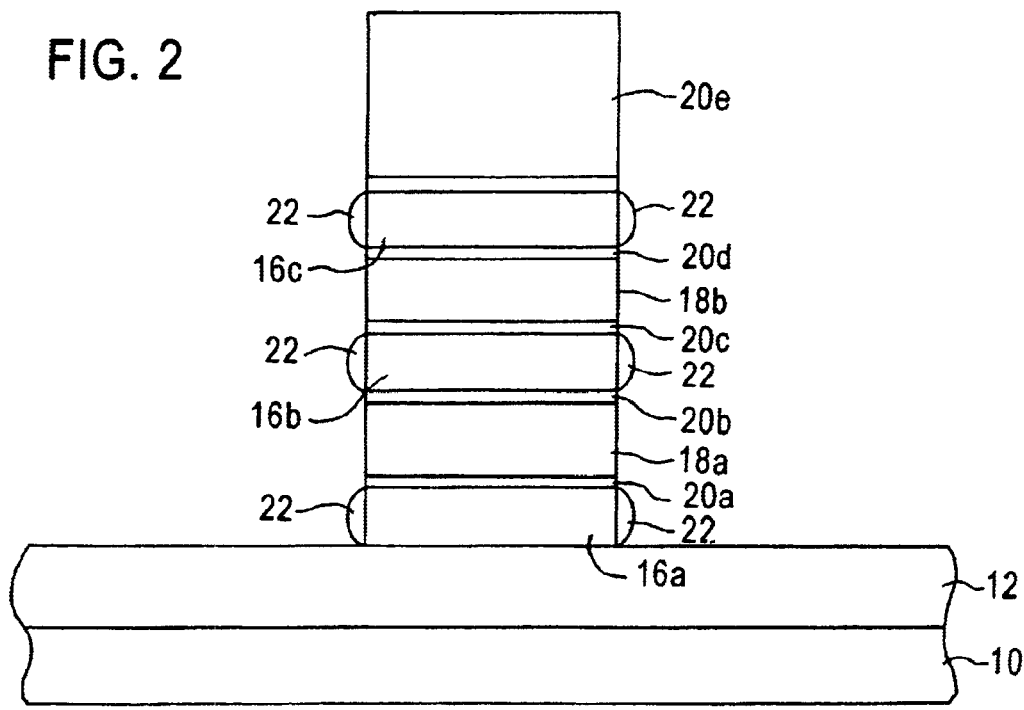
FIG. 2 depicts the structure of FIG. 1 following the oxidation of silicon layers in the stack precursor in accordance with embodiments of the present invention.

FIG. 3 shows the structure of FIG. 2 after a seed window mask has been formed and patterned and an etch is made to etch recesses 24 in the buried oxide layer 12, stopping on the silicon substrate 10. A conventional etch recipe may be employed to etch the buried oxide layer 12 to create the recesses 24. The seed window is then removed, resulting in the structure of FIG. 3.

Following the etching of the recesses 24 into the buried oxide layer 12, the nitride layers 18a–18b are removed by a wet etch, such as hot phosphoric acid. This results in the structure of FIG. 4 in which gaps are created between the oxide layers 20c–20d and 20a–20b.

Next, as seen in FIG. 5, the relatively thin oxide layers 20a–20d and the oxidized regions 22 on the silicon layers 16a–16c are partially removed. The thicker oxide layer 20e and the buried oxide layer 12 may be etched slightly, but substantially remain after the etching. A buffered oxide etch may be used to remove the oxide layers 20a–20d and the oxidized polysilicon regions 22.

As seen in FIG. 6, a gate dielectric 26 is grown around each of the silicon layers 16a–16c. The gate dielectric 26 may be a conventional gate dielectric, such as silicon dioxide. A conventional thermal process may be employed to form the gate dielectric 26. Alternatively, high k material, such as $HfO_2$ or Hf silicate, can be deposited as the gate dielectric 26.

Figure 7:
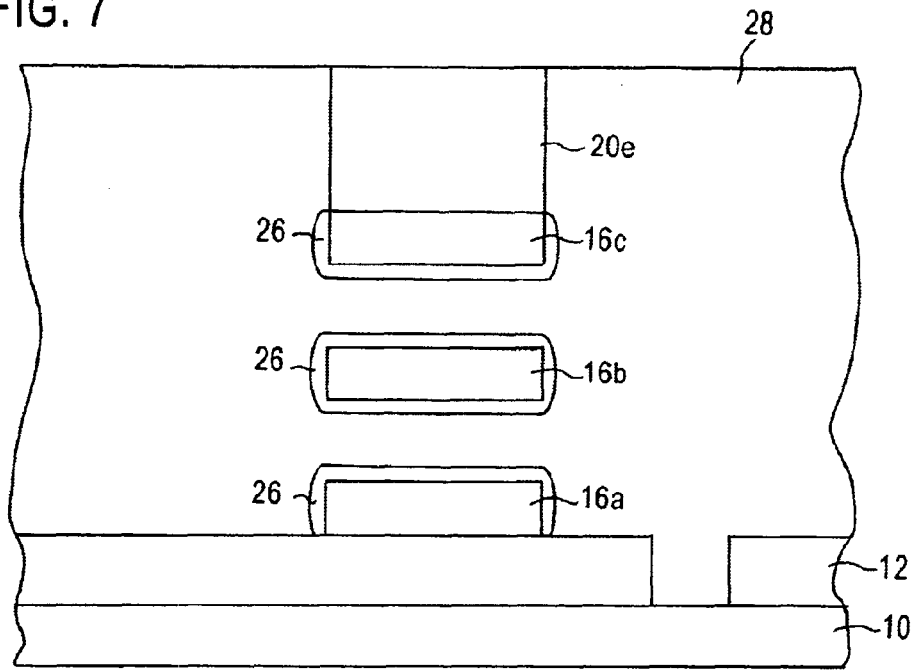
FIG. 7 shows the structure of FIG. 6 after the growth of a silicon layer and polishing of the silicon layer in accordance with embodiments of the present invention.

Silicon is then epitaxially grown to form a silicon layer 28, as depicted in FIG. 7. The silicon layer 28 in FIG. 7 has been polished, with the polishing stopping on the oxide layer 20e. A thickness of between about 2500 to about 5000 Å may be formed in exemplary embodiments of the present invention. A conventional method for epitaxially growing silicon may be employed.

An anisotropic etch of the silicon layer 28 is then performed. This may be done in a conventional manner, such as by creating a mask of photoresist material and etching the silicon layer 28 in accordance with the pattern formed in the mask. The photoresist mask is then removed. The results of the etching are depicted in FIG. 8.

In FIG. 9, an insulative material, such as oxide, is formed at an insulating layer 30. The oxide may be derived from TEOS, for example. The oxide fills the recesses 24 in the buried oxide layer 12. After creation of the insulating layer 30, a polishing step is performed to remove excess oxide.

Figure 8:
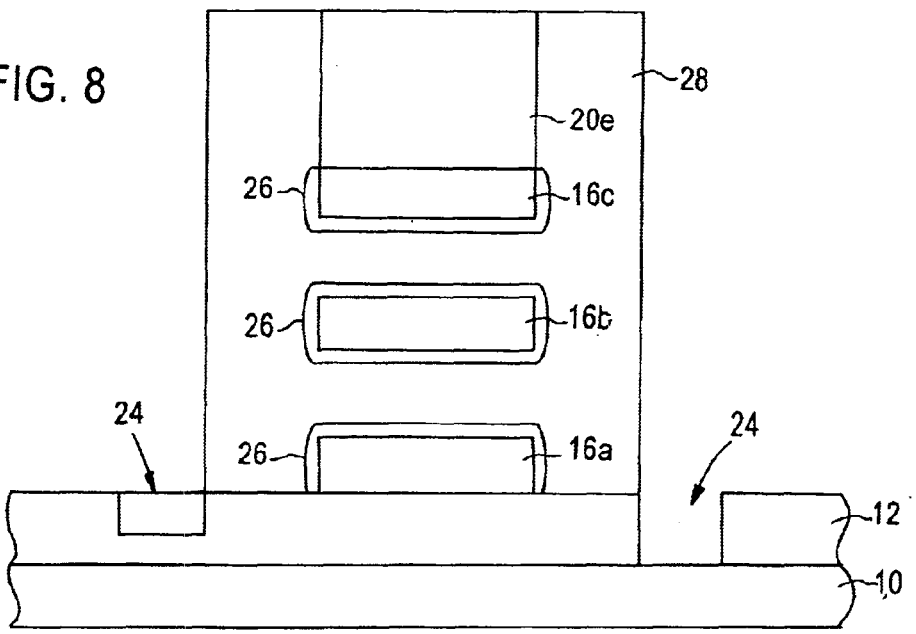
FIG. 8 depicts the structure of FIG. 7 after the silicon has been doped and etched in accordance with embodiments of the present invention.

The doping of the silicon may then be performed, either after the FIG. 9 structure has been reached, or after previous structures have been created, such as those in FIGS. 7 and 8 in alternate embodiments. Doping provides dopants, such as boron or arsenic, or other known dopants, into the silicon 28. For boron, an exemplary implantation energy may be between about 30 to about 50 KeV. For arsenic, an exemplary implantation energy is about 150 to about 250 KeV. The dopants are activated by an annealing step, as is conventionally is performed.

In FIG. 10, the multiple gate transistor is depicted with silicide regions formed in the source and drain regions 32 of the now-formed transistor 36. The silicide regions 34 are formed in a self-aligned silicidation process, as is conventionally known. For example, a metal layer is deposited over the wafer and annealing steps are performed to cause the metal to react with the underlying silicon 28 and form low resistivity silicon regions 34. Exemplary metals for the metal layer include, but are not limited to, cobalt, titanium, tungsten, nickel, platinum, palladium, molybdenum, etc. The silicide 34 provides low resistivity contacts to the source and drain regions 32 of the transistor 36. Any unreacted metal is removed following the rapid thermal anneal or laser thermal anneal that is performed to create silicide regions 34. FIG. 10 depicts the structure after the metal layer has been removed.

The present invention thus provides a transistor with more than two gates, thereby maximizing the drive current for the silicon area. An embodiment in which a semiconductor device has three gates is depicted and described, but the process can be readily extended to produce transistors having a number of gates greater than three.

Although the present invention has been described and illustrated in detail, it is to be clearly understood that the same is by way of illustration and example and is not to be taken by way of limitation, the scope of the present invention being limited only by the terms of the appended claims.

What is claimed is:

1. A method of forming a n-gate semiconductor device, where n is greater than 2, comprising the step of;

forming a stack of n-conductive gate electrode, where n>2;

forming silicon around the gate stack;

doping the silicon to form source/drain region;
wherein the step of forming the stack includes;
forming n polysilicon layers, each polysilicon layer having a first oxide layer directly beneath the polysilicon layer and a second oxide layer directly above the polysilicon layer;
forming nitride layers between the polysilicon layers; and
anisotropically etching the polysilicon layers, the nitride layers and the oxide layers to form a stack precursor.

2. The method of claim 1, wherein the step of forming the stack further includes isotropically etching the nitride layers and at least some of the oxide layers in the stack precursor to thereby create gaps between the polysilicon layers in the stack precursor.

3. The method of claim 2, wherein the step of forming the stack further includes forming gate dielectric material on the polysilicon layers in the stack precursor.

4. The method of claim 3, wherein the step of forming silicon includes epitaxially growing the silicon.

5. The method of claim 4, further comprising etching the silicon anisotropically.

6. The method of claim 5, wherein the stack and the silicon are formed on an insulator layer.

7. The method of claim 6, wherein the insulator layer is a buried oxide (BOX) layer of a silicon-on-insulator (SOI) structure.

8. The method of claim 7, further comprising forming silicide regions in the source/drain regions.

9. The method of claim 1, wherein n=3.

10. A method of forming a MOS device having more than two gates, comprising the steps of:
forming a plurality of polysilicon gates in a stack, the plurality including at least three said gates;
forming gate dielectric on each of the gates;
forming silicon with source/drain regions adjacent the gates and gate dielectric; and
forming a plurality of polisilicon gates includes forming a plurality of oxide nitride and polysilicon layers on an insulator layer formed on a silicon substrate and anisotropically etching the oxide, nitride and silicon layers to form stack precursor.

11. The method of claim 10, further comprising oxidizing portions of the polysilicon layers after the step of anisotropically etching the oxide, nitride and silicon layer.

12. The method of claim 11, further comprising removing the nitride layers from the stack precursor after the oxidizing of portions of the polysilicon layers.

13. The method of claim 12, further comprising removing at least some of the oxide layer from the stack precursor after the oxidizing of portions of the polysilicon layers.

14. The method of claim 12, wherein the step of forming silicon with source/drain regions includes etching portions of the insulator layer to the silicon substrate and epitaxially growing the silicon layer on the insulator layer and the stack precursor.

* * * * *

UNITED STATES PATENT AND TRADEMARK OFFICE
CERTIFICATE OF CORRECTION

PATENT NO. : 6,919,250 B2 Page 1 of 1
DATED : July 19, 2005
INVENTOR(S) : Zoran Krivokapic It is certified that error appears in the above-identified patent and that said Letters Patent is hereby corrected as shown below:

<u>Column 6,</u>
Line 25, after the word "etching" insert -- through --.

Signed and Sealed this

Eighteenth Day of October, 2005

JON W. DUDAS
*Director of the United States Patent and Trademark Office*